United States Patent
Matsudai et al.

(10) Patent No.: US 12,363,929 B2
(45) Date of Patent: Jul. 15, 2025

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Tomoko Matsudai, Tokyo (JP); Hiroko Itokazu, Kawasaki Kanagawa (JP); Keiko Kawamura, Yokohama Kanagawa (JP); Yoko Iwakaji, Tokyo (JP); Kaori Fuse, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 17/012,166

(22) Filed: Sep. 4, 2020

(65) Prior Publication Data

US 2021/0296477 A1    Sep. 23, 2021

(30) Foreign Application Priority Data

Mar. 19, 2020    (JP) .................................. 2020-048761

(51) Int. Cl.
*H10D 8/50*    (2025.01)
*H10D 8/60*    (2025.01)
(Continued)

(52) U.S. Cl.
CPC .............. *H10D 8/605* (2025.01); *H10D 62/83* (2025.01); *H10D 64/23* (2025.01); *H10D 64/62* (2025.01); *H10D 64/64* (2025.01); *H10D 12/481* (2025.01)

(58) Field of Classification Search
CPC ............. H01L 29/6634; H01L 29/7396; H01L 29/66348; H01L 29/7397; H01L 29/8725;
(Continued)

(56) References Cited

U.S. PATENT DOCUMENTS 6,768,177 B1    7/2004  Xu et al.
10,468,487 B2  11/2019  Sugawara et al.
(Continued)

FOREIGN PATENT DOCUMENTS

CN    102044565 A  *  5/2011  ......... H01L 29/0696
CN    106531786 A     3/2017
(Continued)

OTHER PUBLICATIONS

Vivona et al., "Materials and Processes for Schottky Contacts on Silicon Carbide", Materials 2022, 15, 298. https://doi.org/10.3390/ma15010298 (Year: 2022).*
(Continued)

*Primary Examiner* — Yu Chen
(74) *Attorney, Agent, or Firm* — Maier & Maier, PLLC

(57) ABSTRACT

A semiconductor device includes a semiconductor part, first and second electrodes. The semiconductor part includes first to third layers. The first electrode is provided on a back surface of the semiconductor part. The second electrode is provided on a front surface of the semiconductor part. The first layer of a first conductivity type extends between the first and second electrodes. The second layer of a second conductivity type is provided between the first layer and the second electrode. The third layer of the second conductivity type is provided between the second layer and the second electrode. The second electrode includes a buried contact portion and a surface contact portion. The buried contact portion extends into the second layer from the front surface of the semiconductor part and contacts the second layer. The surface contact portion contacts the third layer at the front surface of the semiconductor part.

7 Claims, 7 Drawing Sheets

(51) Int. Cl.
   *H10D 62/83* (2025.01)
   *H10D 64/23* (2025.01)
   *H10D 64/62* (2025.01)
   *H10D 64/64* (2025.01)
   *H10D 12/00* (2025.01)

(58) Field of Classification Search
   CPC . H01L 29/41766; H01L 29/417; H01L 29/47; H01L 29/475; H01L 29/45; H01L 29/452; H01L 29/456; H01L 29/66613–66628; H01L 29/66704; H01L 29/66734; H01L 29/7813; H01L 29/7825; H01L 29/66696; H01L 29/66727; H01L 29/7806; H01L 29/782; H10D 84/141–161; H10D 64/232; H10D 64/252; H10D 64/2527; H10D 64/254; H10D 64/256; H10D 64/117; H10D 64/62; H10D 64/64–649; H10D 8/045; H10D 8/051; H10D 8/422; H10D 8/50; H10D 8/60; H10D 8/605; H10D 12/031; H10D 12/038; H10D 12/481; H10D 30/668; H10D 30/0297; H10D 30/0295
   See application file for complete search history.

(56) References Cited

U.S. PATENT DOCUMENTS

| | | | |
|---|---|---|---|
| 2006/0226475 A1* | 10/2006 | Yamamoto | H01L 29/66727 257/E29.136 |
| 2009/0065814 A1* | 3/2009 | Bhalla | H01L 29/1083 257/230 |
| 2012/0025283 A1* | 2/2012 | Son | H01L 27/10855 257/296 |
| 2012/0313212 A1 | 12/2012 | Sugawara | |
| 2013/0193486 A1 | 8/2013 | Kinoshita et al. | |
| 2014/0070266 A1 | 3/2014 | Matsudai et al. | |
| 2014/0124832 A1 | 5/2014 | Ogura et al. | |
| 2015/0214355 A1* | 7/2015 | Nakano | H01L 29/7805 257/330 |
| 2015/0228723 A1* | 8/2015 | Werber | H01L 29/401 257/140 |
| 2015/0263148 A1 | 9/2015 | Ogura et al. | |
| 2016/0163852 A1* | 6/2016 | Siemieniec | H01L 29/045 438/237 |
| 2016/0284843 A1 | 9/2016 | Niwa et al. | |
| 2017/0047316 A1 | 2/2017 | Katou et al. | |
| 2017/0077089 A1 | 3/2017 | Ogura et al. | |
| 2018/0182889 A1 | 6/2018 | Takaya et al. | |
| 2018/0350968 A1 | 12/2018 | Aichinger et al. | |
| 2018/0358463 A1 | 12/2018 | Kobayashi et al. | |
| 2019/0081147 A1* | 3/2019 | West | H01L 29/42368 |
| 2019/0157389 A1 | 5/2019 | Takano et al. | |

FOREIGN PATENT DOCUMENTS

| | | |
|---|---|---|
| CN | 109478561 A | 3/2019 |
| JP | H05283672 A | 10/1993 |
| JP | 2005229071 A | 8/2005 |
| JP | 2010-147381 A | 7/2010 |
| JP | 2014-56942 A | 3/2014 |
| JP | 2014-57093 A | 3/2014 |
| JP | 2014-112637 A | 6/2014 |
| JP | 2015-126080 A | 7/2015 |
| JP | 2015-177058 A | 10/2015 |
| JP | 2016181534 A | 10/2016 |
| JP | 2017-55079 A | 3/2017 |
| JP | 6109444 B1 | 4/2017 |
| JP | 2018-107342 A | 7/2018 |
| JP | 2018-186305 A | 11/2018 |
| JP | 2019-3968 A | 1/2019 |
| WO | 2011-105434 A1 | 9/2011 |

OTHER PUBLICATIONS

Office Action issued on May 1, 2024, in corresponding Chinese Application No. 202010607336.X, 24 pages.

* cited by examiner

SEMICONDUCTOR DEVICE

CROSS-REFERENCE TO RELATED APPLICATIONS

This application is based upon and claims the benefit of priority from Japanese Patent Application No. 2020-048761, filed on Mar. 19, 2020; the entire contents of which are incorporated herein by reference.

FIELD

Embodiments relate to a semiconductor device.

BACKGROUND

It is desirable for a power semiconductor device to reduce the switching loss without increasing the on-resistance. For example, a freewheeling diode is desired to have the reduced recovery loss during the transition from the on-state to the off-state.

DETAILED DESCRIPTION

Figure 1A:
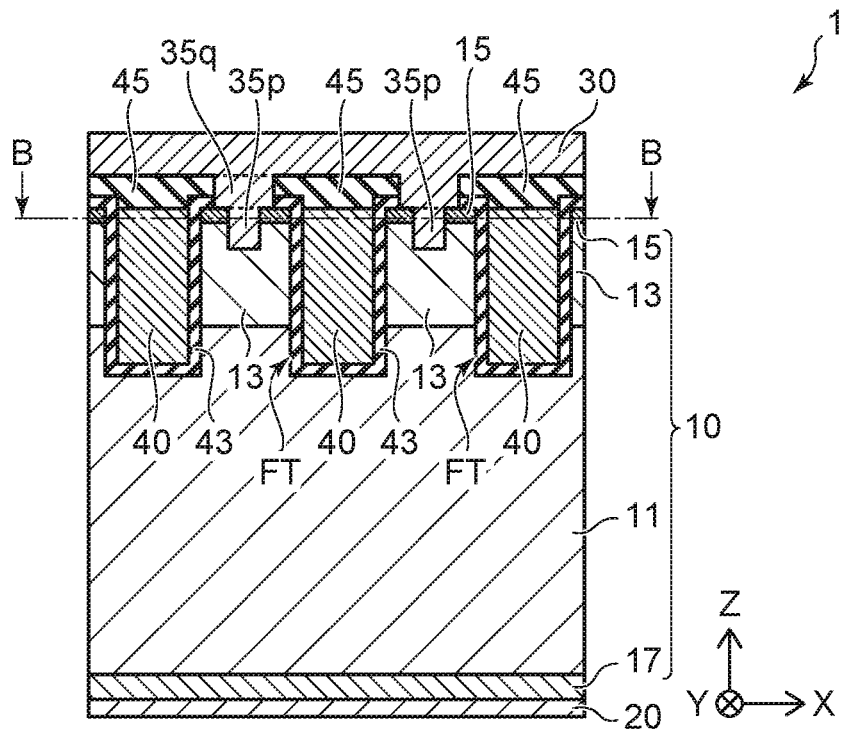
FIGS. 1A and 1B are schematic cross-sectional views a semiconductor device according to a first showing embodiment.

According to one embodiment, a semiconductor device includes a semiconductor part, first and second electrodes. The semiconductor part includes a first semiconductor layer of a first conductivity type, a second semiconductor layer of a second conductivity type, and a third semiconductor layer of the second conductivity type. The first electrode is provided on a back surface of the semiconductor part. The second electrode is provided on a front surface of the semiconductor part. The first semiconductor layer extends between the first and second electrodes. The second semiconductor layer is provided between the first semiconductor layer and the second electrode. The third semiconductor layer is provided between the second semiconductor layer and the second electrode. The third semiconductor layer includes a second conductivity type impurity with a higher concentration than a concentration of a second conductivity type impurity in the second semiconductor layer. The second electrode includes a buried contact portion and a surface contact portion. The buried contact portion extends into the second semiconductor layer from the front surface of the semiconductor part. The buried contact portion contacts the second semiconductor layer. The surface contact portion contacts the third semiconductor layer at the front surface of the semiconductor part.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

Figure 1B:
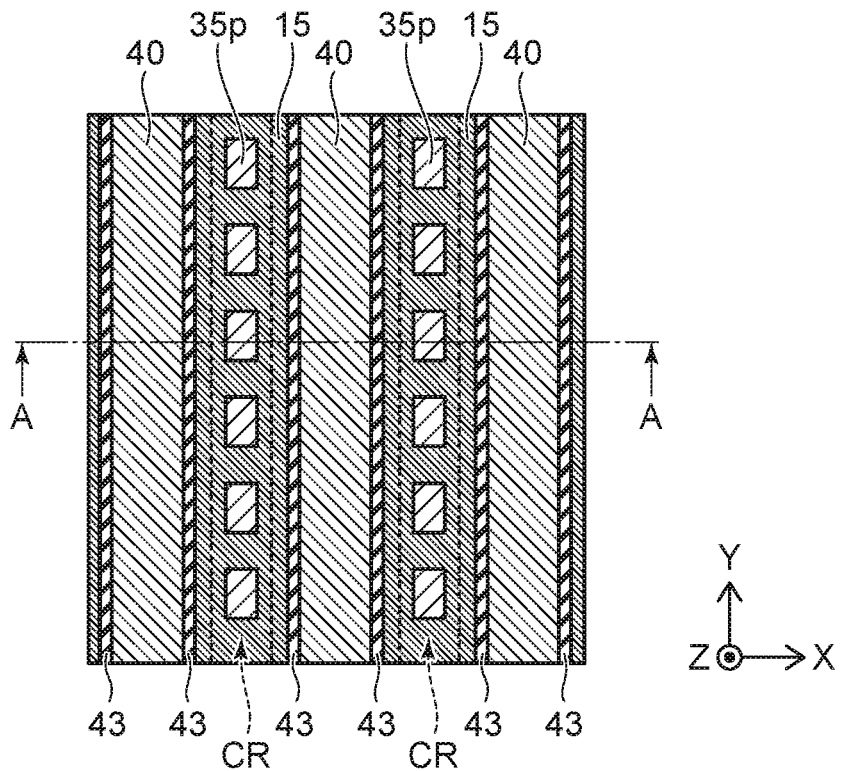

FIGS. 1A and 1B are schematic cross-sectional views showing a semiconductor device 1 according to a first embodiment. The semiconductor device 1 is, for example, a P-I-N diode. FIG. 1A is a cross-sectional view along line A-A shown in FIG. 1B. FIG. 1B is a cross-sectional view along line B-B shown in FIG. 1A.

The semiconductor device 1 includes a semiconductor part 10, a first electrode 20, a second electrode 30, and a third electrode 40. The semiconductor part 10 is provided between the first electrode 20 and the second electrode 30. The semiconductor part 10 has a trench FT provided in the front side thereof, and the third electrode 40 is provided inside the trench FT. The second electrode 30 is provided above the third electrode 40.

The semiconductor part 10 includes a first semiconductor layer 11 of a first conductivity type, a second semiconductor layer 13 of a second conductivity type, a third semiconductor layer 15 of the second conductivity type, and a fourth semiconductor layer 17 of the first conductivity type. The semiconductor part 10 is, for example, silicon. In the description hereinbelow, the first conductivity type is an "n-type", and the second conductivity type is a "p-type".

The first semiconductor layer 11 extends between the first electrode 20 and the second electrode 30. The first semiconductor layer 11 includes, for example, a first conductivity type impurity with a concentration of $1 \times 10^{12}$ to $1 \times 10^{15}$ $cm^{-2}$. For example, the impurity concentration in the first semiconductor layer 11 is set to obtain the desired breakdown voltage. For example, the first semiconductor layer 11 has a thickness of 1 to 1000 μm in a direction from the first electrode 20 toward the second electrode 30 (e.g., the Z-direction). For example, the thickness of the first semiconductor layer 11 is set to obtain the desired breakdown voltage.

The second semiconductor layer 13 is provided between the first semiconductor layer and the second electrode 30. The second semiconductor layer 13 is, for example, a p-type anode layer. The second semiconductor layer 13 includes, for example, a p-type impurity with a surface density of $1 \times 10^{12}$ to $1 \times 10^{14}$ $cm^{-2}$. For example, the second semiconductor layer 13 has a thickness of 0.1 to several μm in the Z-direction.

The third semiconductor layer 15 is provided between the second semiconductor layer 13 and the second electrode 30. The third semiconductor layer 15 includes a second conductivity type impurity with a higher concentration than the concentration of the second conductivity type impurity in the second semiconductor layer 13. The third semiconductor layer 15 is, for example, a p$^+$-type contact layer. The third semiconductor layer 15 includes, for example, a first conductivity type impurity with a surface density of $1 \times 10^{13}$ to $1 \times 10^{15}$ cm$^{-2}$. For example, the third semiconductor layer 15 has a thickness of 0.1 to 10 μm in the Z-direction.

The fourth semiconductor layer 17 is provided between the first semiconductor layer 11 and the first electrode 20. The fourth semiconductor layer 17 includes a first conductivity type impurity with a higher concentration than the concentration of the first conductivity type impurity in the first semiconductor layer 11. The fourth semiconductor layer 17 is, for example, an n-type cathode layer. The fourth semiconductor layer 17 includes, for example, a first conductivity type impurity with a surface density of $1 \times 10^{13}$ to $1 \times 10^{15}$ cm$^{-2}$. For example, the fourth semiconductor layer 17 has a thickness of 0.1 to 10 μm in the Z-direction.

The first electrode 20 is, for example, a cathode electrode. The first electrode 20 is provided on the back surface of the semiconductor part 10. The first electrode 20 contacts the fourth semiconductor layer 17 with, for example, an ohmic connection. The first electrode 20 is, for example, a metal layer including at least one element selected from the group consisting of aluminum (Al), titanium (Ti), nickel (Ni), tungsten (W), gold (Au), polysilicon, etc.

The second electrode 30 is, for example, an anode electrode. The second electrode 30 is provided on the front surface of the semiconductor part 10. The second electrode 30 includes, for example, at least one element selected from the group consisting of aluminum (Al), gold (Au), polysilicon, etc. 15

The third electrode 40 is, for example, conductive polysilicon. The third electrode 40 extends into the first semiconductor layer 11 from the front surface side of the semiconductor part 10. The third electrode 40 is electrically insulated from the semiconductor part 10 by an insulating film 43. Also, the third electrode 40 is electrically insulated from the second electrode 30 by, for example, an inter-layer insulating film 45. The insulating film 43 and the inter-layer insulating film 45 are, for example, silicon oxide films.

For example, the second semiconductor layer 13 faces the third electrode 40 via the insulating film 43. The third semiconductor layer 15 also faces the third electrode 40 via the insulating film 43.

As shown in FIG. 1A, the second electrode 30 includes, for example, a buried contact portion 35p and a surface contact portion 35q. For example, the buried contact portion 35p is embedded in a contact trench that has a depth reaching the second semiconductor layer 13 from the front surface of the semiconductor part 10. For example, the surface contact portion 35q contacts the third semiconductor layer 15 exposed at the front surface of the semiconductor part 10. The "front surface" of the semiconductor part 10 excludes the inner surface of the contact trench.

Due to the difference in the second conductivity type impurity concentration between the second semiconductor layer 13 and the third semiconductor layer 15, the buried contact portion 35p is connected to the second semiconductor layer 13 with, for example, a Schottky connection. The surface contact portion 35q is connected to the third semiconductor layer 15 with, for example, an ohmic connection. In other words, the potential barrier to the holes injected from the buried contact portion 35p into the second semiconductor layer 13 is larger than the potential barrier to the holes injected from the surface contact portion 35q into the third semiconductor layer 15.

As shown in FIG. 1B, for example, the third electrode 40 extends in the Y-direction along the front surface of the semiconductor part 10. Multiple buried contact portions 35p are provided in the semiconductor part 10 and arranged in the Y-direction.

Figure 2A:
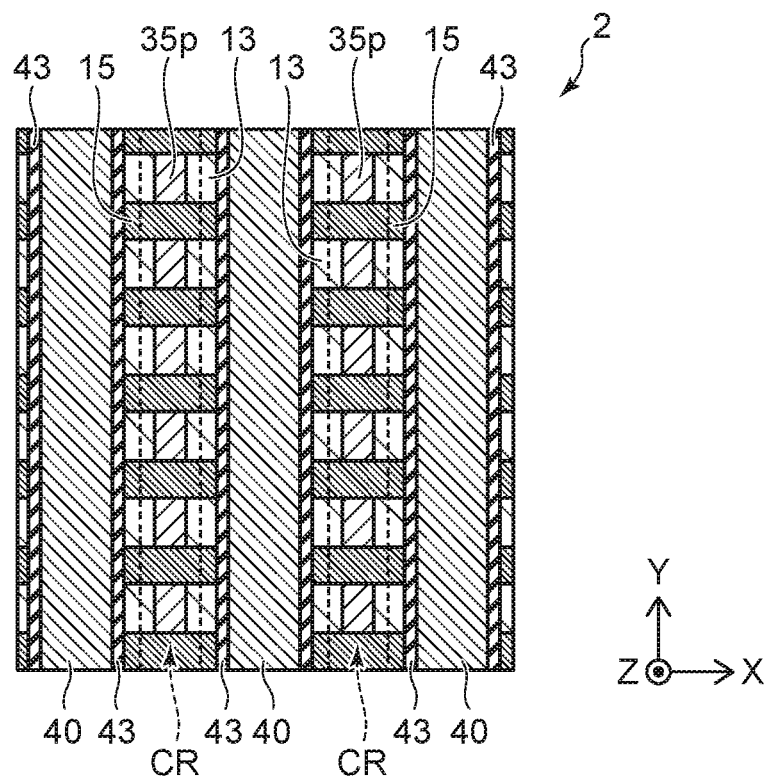
FIGS. 2A and 2B are schematic cross-sectional views showing semiconductor devices according to modifications of the first embodiment.
Figure 2B:
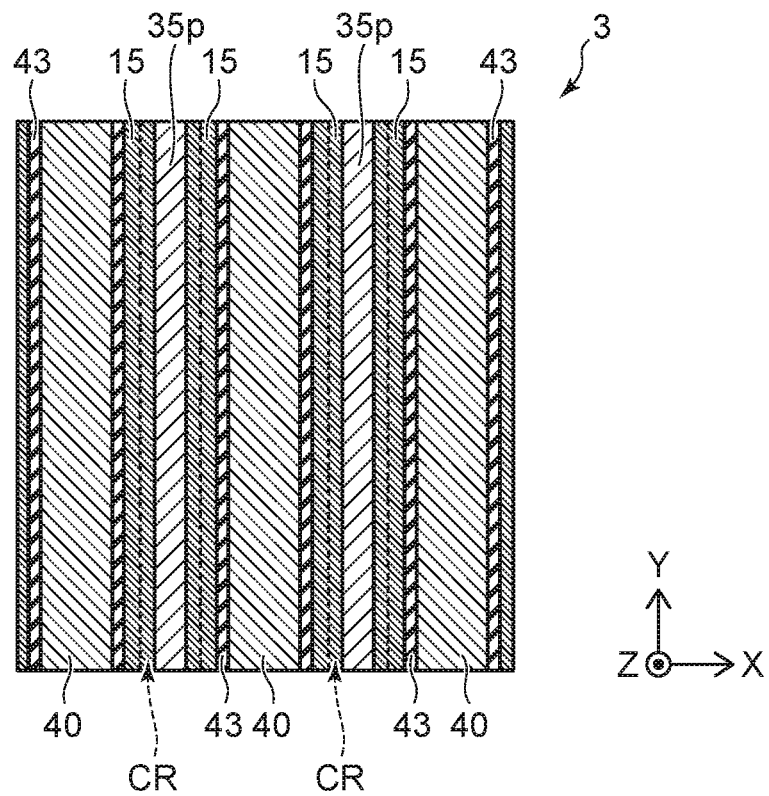

The third semiconductor layer 15 is provided between the buried contact portion 35p and the insulating film 43. The third semiconductor layer 15 also is between two mutually adjacent buried contact portions 35p of the multiple buried contact portions 35p. The surface contact portion 35q extends in the Y-direction and contacts the third semiconductor layer 15 in a contact region CR between broken lines shown in FIG. 1B. FIGS. 2A and 2B are schematic cross-sectional views showing semiconductor devices 2 and 3 according to modifications of the first embodiment. FIGS. 2A and 2B are schematic views showing cross sections corresponding to the cross section of FIG. 1B.

As shown in FIG. 2A, the third semiconductor layer 15 is provided between the mutually-adjacent portions of the multiple buried contact portions 35p. The second semiconductor layer 13 includes portions provided between the insulating film 43 and the buried contact portions 35p.

The surface contact portion 35q contacts both the second semiconductor layer 13 and the third semiconductor layer 15 in the contact region CR. The surface contact portion 35q includes a portion connected to the third semiconductor layer 15 with an ohmic connection, and another portion connected to the second semiconductor layer 13 with a Schottky connection.

For example, the second electrode 30 has a first surface area contacting the third semiconductor layer 15, and a second surface area contacting the second semiconductor layer 13; and the ratio of the first surface area to the second surface area is small compared to that of the semiconductor device 1, In other words, the holes can be reduced, which are injected from the second electrode 30 into the second semiconductor layer 13 via the third semiconductor layer 15.

As shown in FIG. 2B, the buried contact portion 35p may extend continuously in the Y-direction along the third electrode 40. In the contact region CR, the surface contact portion 35q contacts the third semiconductor layer 15 provided between the insulating film 43 and the buried contact portions 35p.

Thus, the buried contact portion 35p is provided to appropriately set the surface area of the second electrode 30 contacting the third semiconductor layer 15. The amount of the holes can be controlled thereby, which are injected from the second electrode 30 into the second semiconductor layer 13 via the third semiconductor layer 15.

For example, in the on-state of the semiconductor devices 1 to 3, the second electrode 30 is biased to a potential higher than the potential of the first electrode 20. The forward bias is applied to the p-n junction between the first semiconductor layer 11 and the second semiconductor layer 13. Thereby, a bipolar operation state occurs in which holes are injected from the second semiconductor layer 13 into the first semiconductor layer 11, and electrons are injected from the fourth semiconductor layer 17 into the first semiconductor layer 11. At this time, the hole injection from the buried contact portion 35p into the second semiconductor layer 13 is suppressed; therefore, the amount of the holes injected into the first semiconductor layer 11 is reduced compared to the case where the buried contact portion 35p is not provided. Accordingly, the amount of the electrons injected from the fourth semiconductor layer 17 into the first semiconductor layer 11 also is reduced. As a result, the carrier density (the density of electrons and holes) in the first semiconductor layer 11 can be reduced in the on-state. In other words, the excessive injection of carriers into the first semiconductor layer 11 can be avoided in the on-state.

Continuing, when the semiconductor devices 1 to 3 transition from the on-state to the off-state, the second electrode 30 is biased to a potential lower than the potential of the first electrode 20, and a reverse bias is applied to the p-n junction between the first semiconductor layer 11 and the second semiconductor layer 13. Thereby, the holes inside the first semiconductor layer 11 are ejected into the second electrode 30 via the second semiconductor layer 13 and the third semiconductor layer 15. The electrons inside the first semiconductor layer 11 are ejected into the first electrode 20 via the fourth semiconductor layer 17.

In the semiconductor devices 1 to 3, the density of the carriers inside the first semiconductor layer 11 is reduced in the on-state; therefore, the time for the holes and the electrons to be ejected and for the first semiconductor layer 11 to be depleted can be shortened. In other words, in the semiconductor devices 1 to 3, the recovery time from the on-state to the off-state can be shortened, and the recovery loss can be reduced.

Also, by applying a negative control voltage between the second electrode 30 and the third electrode 40, an inversion layer of the second conductivity type can be induced between the first semiconductor layer 11 and the insulating film 43. A hole ejection path from the first semiconductor layer 11 to the second semiconductor layer 13 via the inversion layer of the second conductivity type is formed thereby. Thus, the ejection of the holes is promoted, and the recovery time can be shortened to reduce the recovery loss. Also, the holes generated by the avalanche phenomenon can be ejected efficiently while depleting the first semiconductor layer 11; and the device may have the improved immunity to the breakdown.

Second Embodiment

Figure 3:
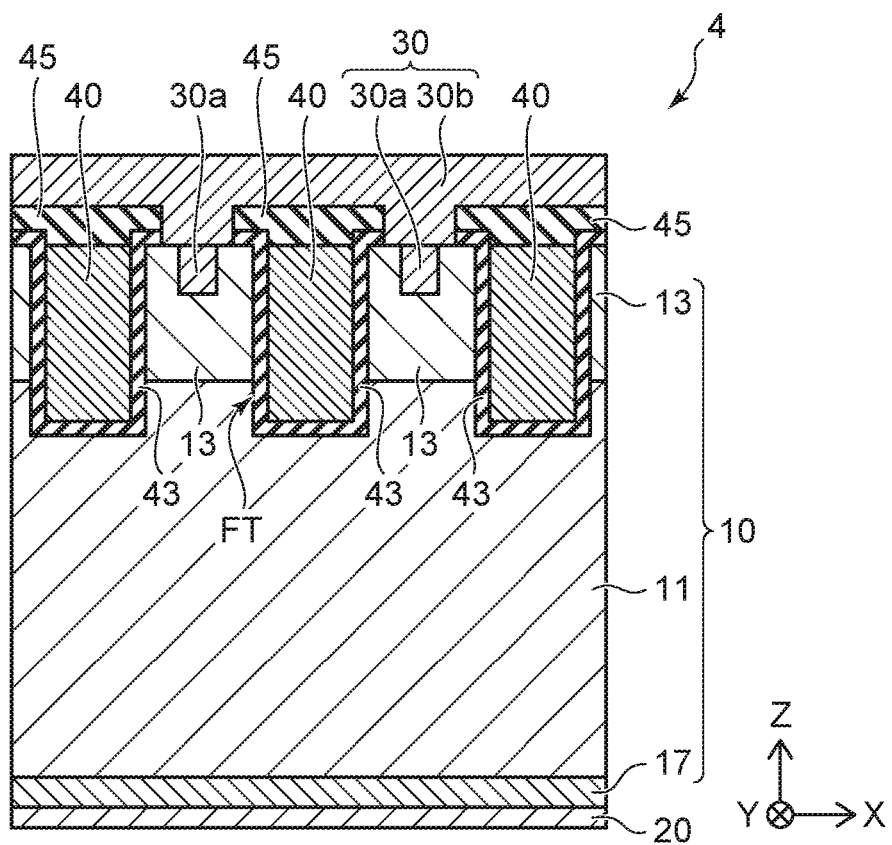
FIG. 3 is a schematic cross-sectional view showing a semiconductor device according to a second embodiment.

FIG. 3 is a schematic cross-sectional view showing a semiconductor device 4 according to a second embodiment. The semiconductor device 4 includes the semiconductor part 10, the first electrode 20, the second electrode 30, and the third electrode 40.

The semiconductor part 10 of the semiconductor device 4 includes the first semiconductor layer 11, the second semiconductor layer 13, and the fourth semiconductor layer 17. In the example, the semiconductor part 10 does not include the third semiconductor layer 15.

The second electrode 30 includes, for example, a first metal portion 30a and a second metal portion 30b. The first metal portion 30a extends into the second semiconductor layer 13 from the front surface of the semiconductor part 10. The second metal portion 30b covers the front side of the semiconductor part 10. The second metal portion 30b is connected to the first metal portion 30a. The second metal portion 30b includes a portion contacting the second semiconductor layer 13 at the front surface of the semiconductor part 10. For example, the first metal portion 30a is provided with a manner similarly to the buried contact portion 35p of the semiconductor devices 1 to 3.

The third electrode 40 is provided between the semiconductor part 10 and the second metal portion 30b. The third electrode 40 electrically insulated from the semiconductor part 10 by the insulating film 43 and is electrically insulated from the second metal portion 30b by the inter-layer insulating film 45.

The first metal portion 30a includes a material that forms, for example, a Schottky barrier to the second semiconductor layer 13. The second metal portion 30b includes a material that forms, for example, an ohmic connection with the second semiconductor layer 13. In other words, the potential barrier to the holes injected from the first metal portion 30a into the second semiconductor layer 13 is larger than the potential barrier to the holes injected from the second metal portion 30b into the second semiconductor layer 13.

The first metal portion 30a includes, for example, titanium nitride (TIN) at the portion contacting the second semiconductor layer 13. The second metal portion 30b includes, for example, an aluminum-silicon alloy at the portion contacting the second semiconductor layer 13.

Also, in the example, the hole injection from the first metal portion 30a into the second semiconductor layer 13 is suppressed, and the recovery time can be shortened to reduce the recovery loss. Since the third semiconductor layer 15 is not provided, the constraint, for example, on the spacing between the first metal portion 30a and the third electrode 40 can be relaxed, and it is easy to downscale the connection structure between the semiconductor part 10 and the second electrode 30.

Figure 4A:
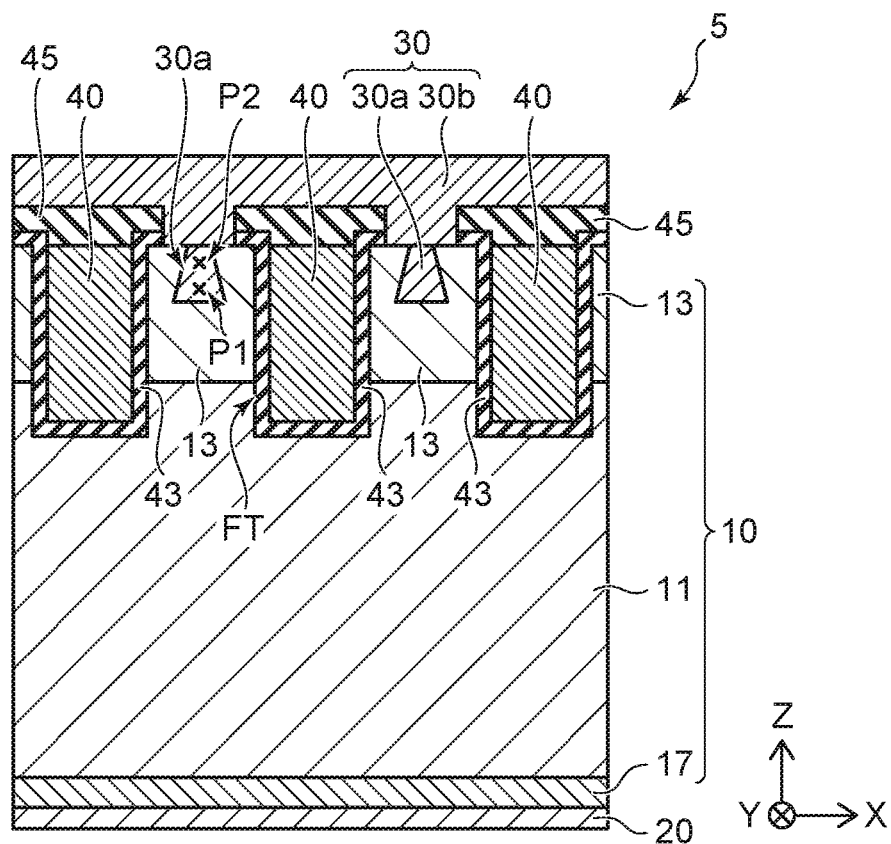
FIGS. 4A and 4B are schematic cross-sectional views showing semiconductor devices according to modifications of the second embodiment.
Figure 4B:
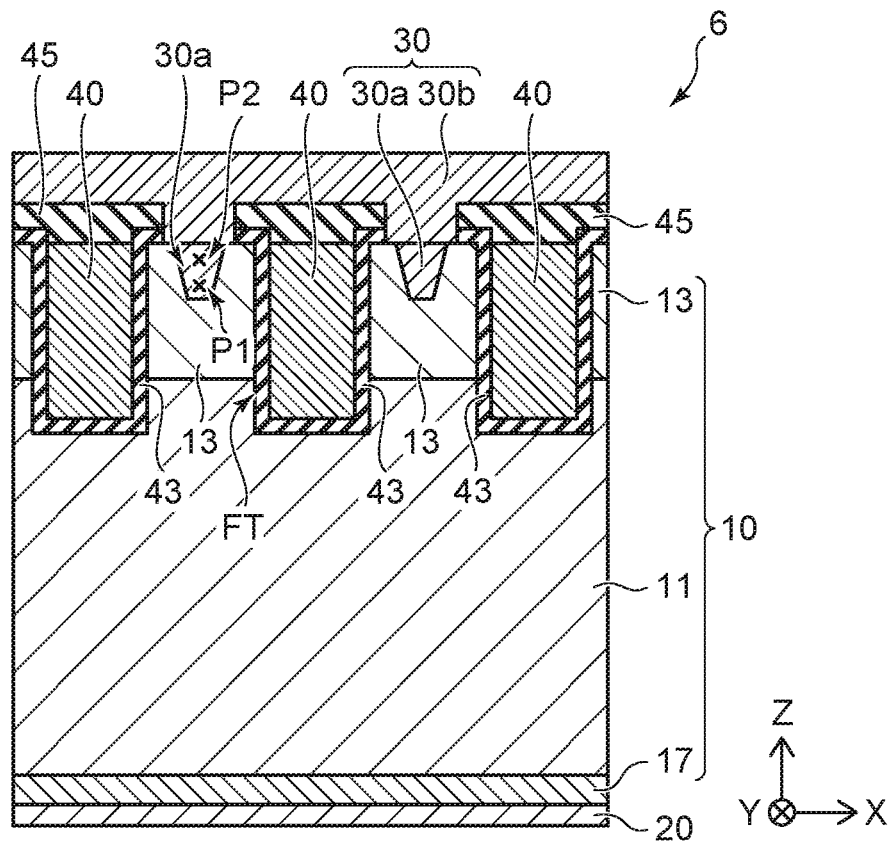

FIGS. 4A and 4B are schematic cross-sectional views showing semiconductor devices 5 and 6 according to modifications of the second embodiment. In the semiconductor devices 5 and 6, the first metal portion 30a has a cross section that is tapered in the Z-direction.

In the semiconductor device 5 shown in FIG. 4A, the first metal portion 30a is provided so that the width in the lateral direction (the X-direction) widens in the direction from the front surface of the semiconductor part 10 toward the first electrode 20. In other words, the first metal portion 30a has a first width in the X-direction at a first position P1, and a second width in the X-direction at a second position P2. The first position P1 and the second position P2 are arranged in the Z-direction, and the first position P1 is positioned between the second position P2 and the first electrode 20. The first width is greater than the second width.

In the semiconductor device 6 shown in FIG. 4B, the first metal portion 30a is provided so that the width in the lateral direction (the X-direction) decreases in the direction from the front surface of the semiconductor part 10 toward the first electrode 20. The first metal portion 30a also has a first width in the X-direction at a first position P1, and a second width in the X-direction at a second position P2. In the example, the first width is less than the second width.

Thus, by providing the first metal portion 30a with a tapered cross section, the surface area that contacts the second semiconductor layer 13 can be increased, and the hole injection from the second electrode 30 into the second semiconductor layer 13 can be suppressed further.

The cross-sectional configuration of the first metal portion 30a is not limited to the example. The buried contact portion 35p of FIGS. 1A and 7 may have the same cross-section.

Figure 5:
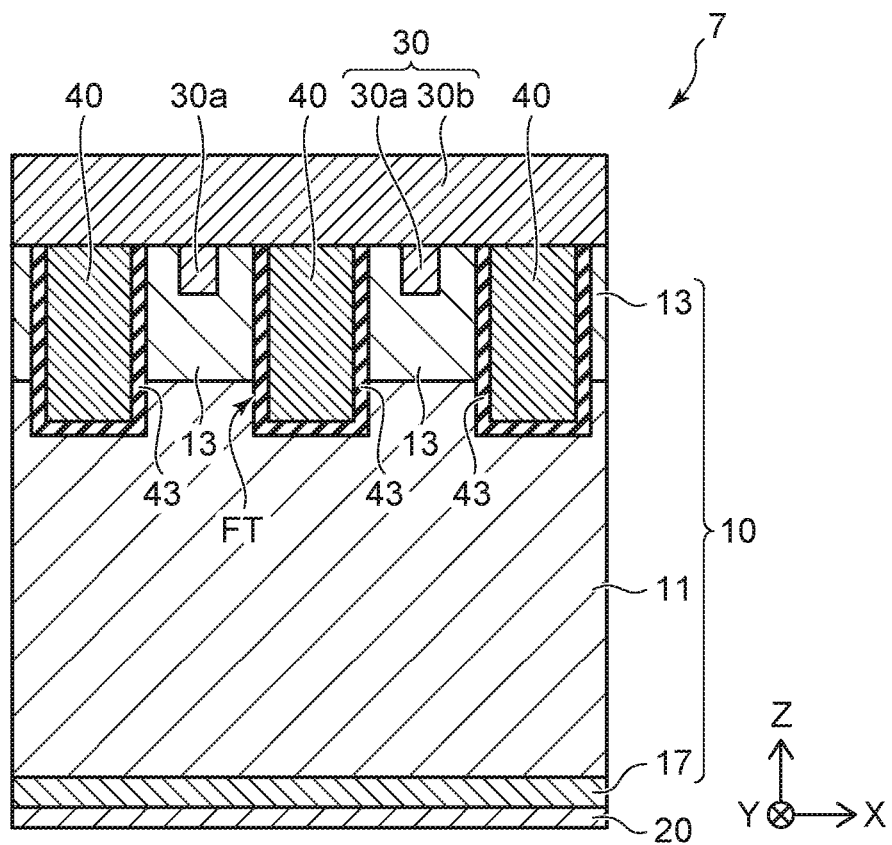
FIG. 5 is a schematic cross-sectional view showing a semiconductor device according to another modification of the second embodiment.

FIG. 5 is a schematic cross-sectional view showing a semiconductor device 7 according to another modification of the second embodiment. In the example, the third electrode 40 is electrically connected to the second electrode 30.

As shown in FIG. 5, the second electrode 30 includes the first metal portion 30a and the second metal portion 30b, and the third electrode 40 is electrically connected to the second metal portion 30b. The third electrode 40 is electrically insulated from the semiconductor part 10 by the insulating film 43.

In the example, the inter-layer insulating film 45 is not provided, and the third electrode 40 is directly connected to the second metal portion 30b. The embodiment is not limited to the example. For example, the inter-layer insulating film 45 is provided between the second electrode 30 and the third electrode 40, and the second electrode 30 and the third electrode 40 are electrically connected via a contact hole in the inter-layer insulating film 45. The second electrode 30 and the third electrode 40 may be electrically connected in the other examples of the specification.

Figure 6:
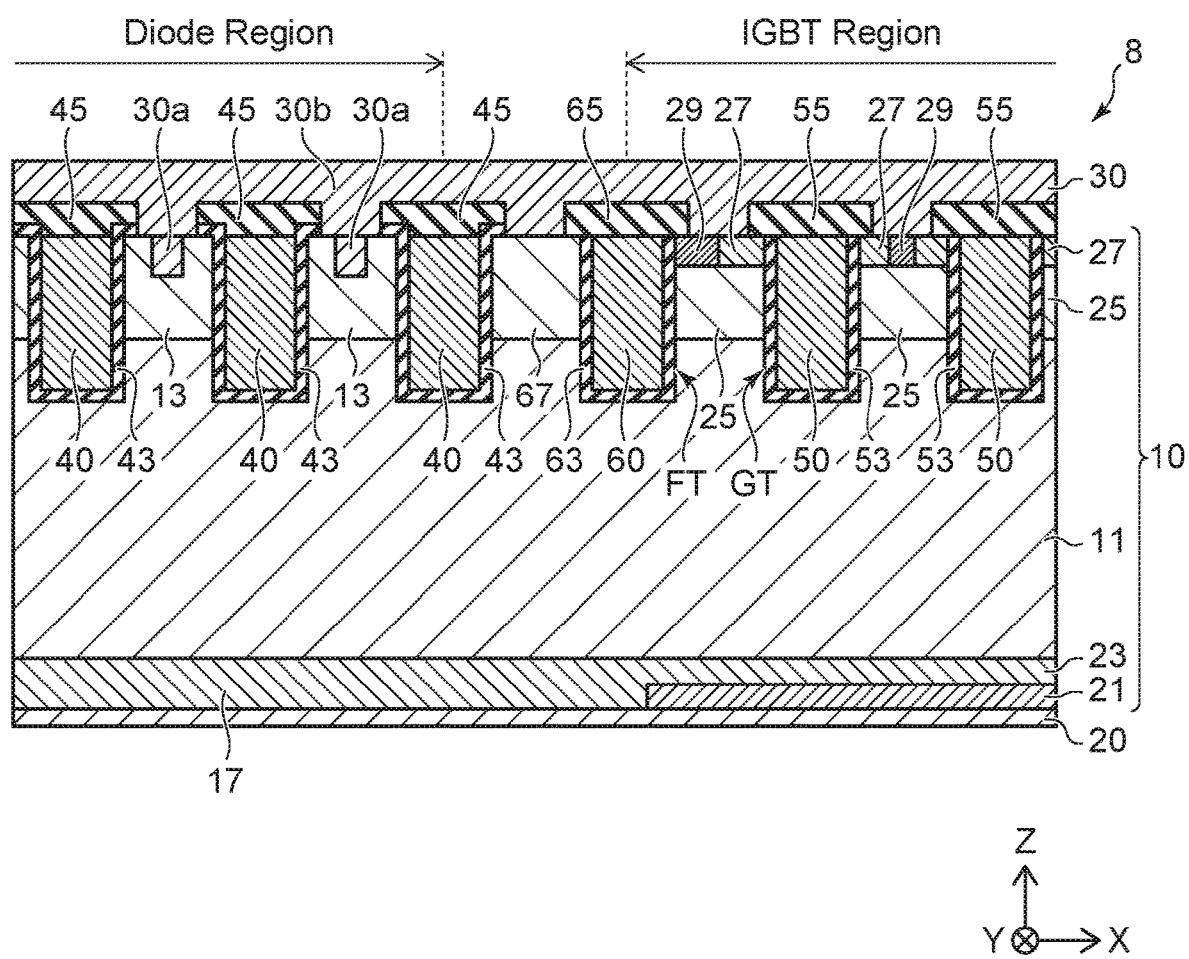
FIG. 6 is a schematic cross-sectional view showing a semiconductor device according to another modification of the second embodiment.

FIG. 6 is a schematic cross-sectional view showing a semiconductor device 8 according to another modification of the second embodiment. The semiconductor device 8 has a structure in which an IGBT is integrated with the semiconductor device 4 shown in FIG. 3.

As shown in FIG. 6, the semiconductor device 8 includes a diode region and an IGBT region. In addition to the third electrode 40 provided in the diode region, the semiconductor device 8 includes a fourth electrode 50 and a fifth electrode 60 provided in the IGBT region.

The fourth electrode 50 is provided between the semiconductor part 10 and the second electrode 30. The fourth electrode 50 is disposed inside a gate trench GT provided in the semiconductor part 10. The fourth electrode 50 is electrically insulated from the semiconductor part 10 by an insulating film 53 and is electrically insulated from the second electrode 30 by an inter-layer insulating film 55.

The fifth electrode 60 is provided at the end of the IGBT region. The fifth electrode 60 is provided between the semiconductor part 10 and the second electrode 30. The fifth electrode 60 is disposed inside the trench FT provided in the semiconductor part 10. The fifth electrode 60 is electrically insulated from the semiconductor part 10 by an insulating film 63. For example, the fifth electrode 60 is electrically connected to the second electrode 30 at a not-illustrated portion.

The semiconductor part 10 includes the first semiconductor layer 11, the second semiconductor layer 13, and the fourth semiconductor layer 17 in the diode region. The first semiconductor layer 11 extends through both the diode region and the IGBT region. The second semiconductor layer 13 and the fourth semiconductor layer 17 are disposed similarly to those of the semiconductor device 4 shown in FIG. 3.

The semiconductor part 10 further includes a fifth semiconductor layer 21 of the second conductivity type, a sixth semiconductor layer 23 of the first conductivity type, a seventh semiconductor layer 25 of the second conductivity type, an eighth semiconductor layer 27 of the first conductivity type, and a ninth semiconductor layer 29 of the second conductivity type in the IGBT region.

The fifth semiconductor layer 21 is provided between the first semiconductor layer 11 and the first electrode 20. The fifth semiconductor layer 21 is, for example, a p-type collector layer and is electrically connected to the first electrode 20. The sixth semiconductor layer 23 is provided between the first semiconductor layer 11 and the fifth semiconductor layer 21. The sixth semiconductor layer 23 is, for example, an n-type buffer layer and includes a first conductivity type impurity with a higher concentration than the concentration of the first conductivity type impurity in the first semiconductor layer 11.

The seventh semiconductor layer 25 is provided between the first semiconductor layer 11 and the second electrode 30.

The seventh semiconductor layer 25 is, for example, a p-type base layer and faces the fourth electrode 50 via the insulating film 53. For example, the seventh semiconductor layer 25 includes substantially the same second conductivity type impurity as the concentration of the second conductivity type impurity in the second semiconductor layer 13.

The eighth semiconductor layer 27 is selectively provided between the seventh semiconductor layer 25 and the second electrode 30. The eighth semiconductor layer 27 is provided at a position contacting the insulating film 53. The eighth semiconductor layer 27 includes a first conductivity type impurity with a higher concentration than the concentration of the first conductivity type impurity of the first semiconductor layer 11.

The ninth semiconductor layer 29 is selectively provided between the seventh semiconductor layer 25 and the second electrode 30. The ninth semiconductor layer 29 includes a second conductivity type impurity with a higher concentration than the concentrations of the second conductivity type impurities in the second semiconductor layer 13 and the seventh semiconductor layer 25.

For example, the second electrode 30 is in contact with the eighth semiconductor layer 27 and the ninth semiconductor layer 29 and electrically connected thereto.

The semiconductor part 10 further includes a tenth semiconductor layer 67 of the second conductivity type. The tenth semiconductor layer 67 is provided in an intermediate region between the diode region and the IGBT region. The tenth semiconductor layer 67 is provided between the first semiconductor layer 11 and the second electrode 30. The tenth semiconductor layer 67 is provided between the third electrode 40 positioned at the end of the diode region and the fifth electrode 60 positioned at the end of the IGBT region. For example, the tenth semiconductor layer 67 includes a second conductivity type impurity with substantially the same concentration as the concentrations of the second conductivity type impurities in the second semiconductor layer 13 and the seventh semiconductor layer 25.

The semiconductor device 8 operates as the IGBT when the second electrode 30 is biased to a potential lower than the potential of the first electrode 20. On the other hand, the semiconductor device 8 operates as a so-called freewheeling diode when the second electrode 30 is biased to a potential higher than the potential of the first electrode 20.

Because the second electrode 30 includes the first metal portion 30a and the second metal portion 30b in the semiconductor device 8, the switching loss (i.e., the recovery loss) can be reduced while recovering from the diode mode to the IGBT mode. Also, by appropriately controlling the third electrode 40, the recovery loss can be reduced further, and the breakdown immunity when recovering can be increased.

The embodiment is not limited to the combination of the IGBT and the semiconductor device 4; for example, an IGBT and the semiconductor devices shown in the first to third embodiments may be combined.

Third Embodiment

Figure 7:
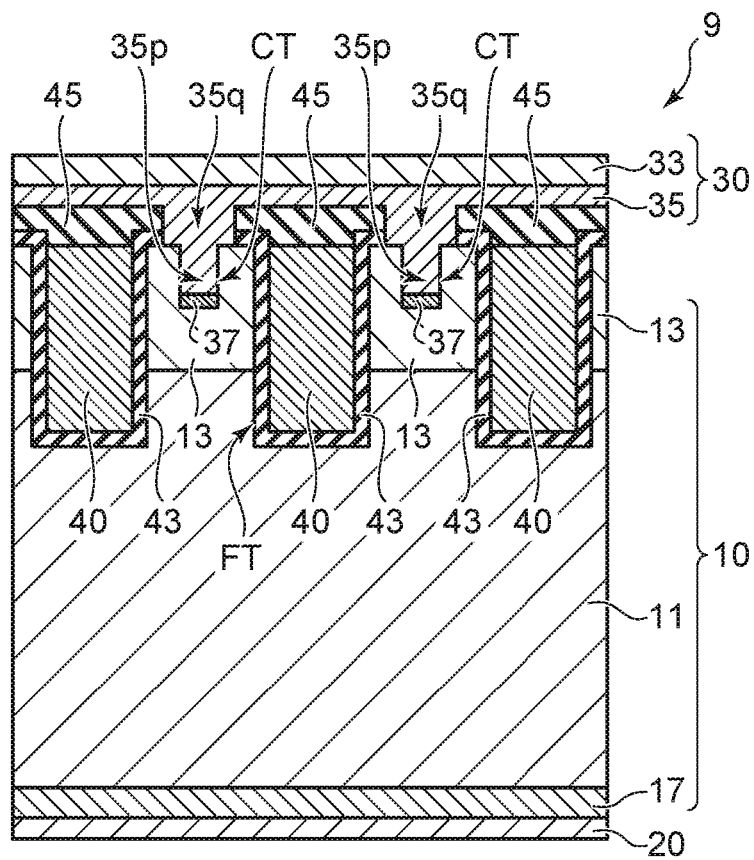
FIG. 7 is a schematic cross-sectional view showing a semiconductor device according to a third embodiment.

FIG. 7 is a schematic cross-sectional view showing a semiconductor device 9 according to a third embodiment. The semiconductor device 9 includes the semiconductor part 10, the first electrode 20, the second electrode 30, and the third electrode 40.

The semiconductor part 10 of the semiconductor device 9 includes the first semiconductor layer 11, the second semiconductor layer 13, and the fourth semiconductor layer 17.

Also, in the example, the semiconductor part 10 does not include the third semiconductor layer 15.

For example, the second electrode 30 has a stacked structure including a first metal layer 33 and a second metal layer 35. The second metal layer 35 is provided between the semiconductor part 10 and the first metal layer 33. The second metal layer 35 includes a metallic element different from the metallic element included in the first metal layer 33.

The second metal layer 35 includes, for example, the buried contact portion 35p and the surface contact portion 35q. The buried contact portion 35p extends into the second semiconductor layer 13 from the front surface of the semiconductor part 10. For example, the surface contact portion 35q contacts the second semiconductor layer 13 at the front surface of the semiconductor part 10. For example, the buried contact portion 35p is provided with a manner similarly to the buried contact portions 35p of the semiconductor devices 1 to 3.

The buried contact portion 35p and the surface contact portion 35q have, for example, Schottky connections with the second semiconductor layer 13. In other words, the buried contact portion 35p and the surface contact portion 35q are connected to the second semiconductor layer 13 with potential barriers to holes injected from the second metal layer 35 into the second semiconductor layer 13.

The semiconductor device 9 further includes an alloy layer 37 selectively provided between the second semiconductor layer 13 and the buried contact portion 35p. The alloy layer 37 is provided at a position between the buried contact portion 35p and the first electrode 20. For example, the alloy layer 37 is positioned on the bottom surface of a contact trench CT provided in the front side of the semiconductor part 10. The alloy layer 37 is, for example, a silicide layer including titanium (Ti), nickel (Ni), or cobalt (Co).

For example, the alloy layer 37 is formed after the inner wall of the contact trench CT is covered with a protective film such as a silicon oxide film or the like so that the bottom surface of the contact trench CT is exposed. A metal layer including titanium, nickel, or cobalt is formed to cover the inner surface of the contact trench CT, and then, the second semiconductor layer 13 and the metal layer react by heat treatment. The buried contact portion 35p is embedded into the contact trench CT after removing the metal layer and the protective film.

For example, the buried contact portion 35p has an ohmic connection with the second semiconductor layer 13 via the alloy layer 37. In other words, the potential barrier to holes at the portion of the buried contact portion 35p contacting the second semiconductor layer 13 is higher than the potential barrier to holes injected from the buried contact portion 35p into the second semiconductor layer 13 via the alloy layer 37.

Thus, in the semiconductor device 9, the hole injection from the second electrode 30 into the second semiconductor layer 13 can be suppressed at the portions of the buried contact portion 35p and the surface contact portion 35q contacting the second semiconductor layer 13. Thereby, the recovery time can be shortened to reduce the recovery loss. Also, in the example, because the third semiconductor layer 15 is not provided, it is easy to downscale the connection structure between the semiconductor part 10 and the second electrode 30.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention,

What is claimed is:

1. A semiconductor device, comprising:
    a semiconductor part including a first semiconductor layer of a first conductivity type, a second semiconductor layer of a second conductivity type opposite the first conductivity type, and a third semiconductor layer of the second conductivity type;
    a first electrode provided on a back surface of the semiconductor part;
    a second electrode provided on a front surface of the semiconductor part, a third electrode provided between the semiconductor part and the second electrode, and
    an inter-layer insulating film provided between the third electrode and the second electrode,
    the third electrode being provided inside the semiconductor part, the third electrode being electrically insulated from the semiconductor part by a first insulating film, the third electrode being electrically insulated from the second electrode by the inter-layer insulating film, the third electrode having a largest dimension extending in an extension direction along the front surface of the semiconductor part,
    the first semiconductor layer extending between the first and second electrodes,
    the second semiconductor layer being provided between the first semiconductor layer and the second electrode,
    the third semiconductor layer being provided between the second semiconductor layer and the second electrode, the third semiconductor layer including a second conductivity type impurity with a higher concentration than a concentration of a second conductivity type impurity in the second semiconductor layer, the third semiconductor layer directly contacts the second semiconductor layer,
    the second electrode including a plurality of buried contact portions and a surface contact portion, the plurality of buried contact portions extending into the second semiconductor layer from the front surface of the semiconductor part, the surface contact portion contacting the front surface of the semiconductor part,
    the plurality of buried contact portions being arranged one by one in a line arrangement, the line arrangement is in the extension direction of the third electrode, the plurality of the buried contact portions directly contacting the second semiconductor layer, the surface contact portion directly contacting an uppermost planar surface of the third semiconductor layer.

2. The semiconductor device according to claim 1, wherein
    the buried contact portions are connected to the second semiconductor layer with a first potential barrier to second conductivity type carriers injected from the buried contact portion into the second semiconductor layer, and
    the first potential barrier is higher than a second potential barrier to second conductivity type carriers injected from the surface contact portion into the third semiconductor layer.

3. The semiconductor device according to claim 1, wherein the third semiconductor layer is provided between two mutually-adjacent buried contact portions of the plurality of buried contact portions of the second electrode, the two mutually-adjacent buried contact portions being in the line arrangement of the plurality of buried contact portions, and the surface contact portion of the second electrode contacts the second semiconductor layer and the third semiconductor layer at the front surface of the semiconductor part.

4. The semiconductor device according to claim 1, wherein the plurality of buried contact portions extends through the third semiconductor layer into the second semiconductor layer.

5. The semiconductor device according to claim 1, wherein the buried contact portions each include first and second positions directed from the second electrode toward the first electrode, the first position being provided between the second position and the first electrode; and the buried contact portions each have a first width at the first position and a second width at the second position, the first and second widths being defined along the front surface of the semiconductor part, the first width being greater than the second width.

6. The semiconductor device according to claim 1, wherein the buried contact portions each include first and second positions arranged directed from the second electrode toward the first electrode, the first position being provided between the second position and the first electrode; and the buried contact portions each have a first width at the first position and a second width at the second position, the first and second widths being defined along the front surface of the semiconductor part, the first width being less than the second width.

7. The semiconductor device according to claim 1, wherein the semiconductor part further includes a fourth semiconductor layer of the first conductivity type, the fourth semiconductor layer being provided between the first semiconductor layer and the first electrode, the fourth semiconductor layer including a first conductivity type impurity with a higher concentration than a concentration of a first conductivity type impurity in the first semiconductor layer.

\* \* \* \* \*